United States Patent [19]

Sterling

[11] 4,261,773
[45] Apr. 14, 1981

[54] ELECTRICAL CONNECTION MEANS FOR A LINEAR PHOTOFLASH LAMP ARRAY

[75] Inventor: Vaughn C. Sterling, Cleveland Heights, Ohio

[73] Assignee: General Electric Company, Schenectady, N.Y.

[21] Appl. No.: 105,681

[22] Filed: Dec. 20, 1979

Related U.S. Application Data

[62] Division of Ser. No. 963,027, Nov. 22, 1978.

[51] Int. Cl.³ .......................... H01B 17/26; B32B 3/26
[52] U.S. Cl. .......................................... 156/48; 264/36; 362/13; 427/140; 428/63; 428/551; 428/601; 431/357; 431/359
[58] Field of Search .......................... 428/63, 601, 551; 431/357, 359; 362/13; 156/48; 264/36; 427/96, 126, 140, 142

[56] References Cited

U.S. PATENT DOCUMENTS

| | | | |
|---|---|---|---|
| 3,988,647 | 10/1976 | Bolon et al. | 431/359 X |
| 4,061,703 | 12/1977 | Rothenberg et al. | 156/48 X |
| 4,088,801 | 5/1978 | Bolon et al. | 427/96 X |

Primary Examiner—Thomas J. Herbert, Jr.
Attorney, Agent, or Firm—John F. McDevitt; Lawrence R. Kempton; Philip L. Schlamp

[57] ABSTRACT

Means are provided to repair one or more flash lamps in a linear type photoflash lamp array which have become disconnected from the circuit board member. Specifically, the disconnected in-lead is secured to the sequential firing circuitry located on the circuit board member with an adhesive deposit of an organic polymer and a surface conductive path thereafter established on said adhesive deposit between the in-lead and the adjacent circuitry. The surface conductive path can also be an organic polymer containing an electrically conductive filler.

3 Claims, 2 Drawing Figures

ELECTRICAL CONNECTION MEANS FOR A LINEAR PHOTOFLASH LAMP ARRAY

This is a division of application Ser. No. 963,027, filed Nov. 22, 1978.

BACKGROUND OF THE INVENTION

Various type planar or linear photoflash lamp arrays are known wherein the individual lamps are electrically connected to sequential firing circuitry located on the circuit board member of said array. A unit of this type is disclosed in U.S. Pat. No. 3,956,625, issued to R. M. Anderson and assigned to the assignee of the present invention which has the individual lamps arranged in two rows of side-by-side reflector units and being electrically connected to conductive strips patterned in accordance with the desired use to provide the firing circuitry on the circuit board member. The circuit board member of this array employs strips of a conductive ink deposited on a vitreous enamel substrate of the circuit board member with electrical connection of the flash lamp in-lead elements being made to the conductive ink strips by conventional soldering. The vibration and heating of these electrically connected flash lamps during further manufacture frequently occasions shaling of the enamel substrate and results in electrical disconnection of one or more of the flash lamp in-leads. To repair a disconnected termination requires not only that the shaled enamel be repaired but circuit continuity must also be re-established. Ordinary repair techniques such as regular adhesives, resoldering, ultrasonic sound, and low melting point glasses have not proven satisfactory, especially after humidity exposure of the repaired termination so that an alternative repair technique had to be developed which could be carried out both effectively and efficiently.

SUMMARY OF THE INVENTION

It is an object of the invention, therefore, to provide means for electrically reconnecting a photoflash in-lead to the associated sequential firing circuit located on the circuit board member of a planar flash array having a novel construction and without impairing performance of the flash lamp array.

Another important object of the invention is to provide means for electrically reconnecting the flash lamp in-leads which does not further require undue repair of the associated circuitry before electrical termination can be re-established.

Briefly stated, the present means for electrically reconnecting a photoflash lamp in-lead to the sequential firing circuitry located on the circuit board member of a planar-type flash lamp array comprises adhesively securing the end of the disconnected in-lead to the circuitry and thereafter providing a surface conductive path interconnecting the secured in-lead to the adjacent circuit strip. In its simplest embodiment for reconnecting the flash lamp in-lead to a circuit board member having an enameled surface, a two-step repair procedure is employed wherein the disconnected in-lead is first bonded to the appropriate circuitry strip with a premixed liquid adhesive and the conductive path is then provided on the surface of the dried or cured adhesive deposit with an organic polymer coating containing conductor particulates. For enameled surfaces which are particularly glossy or not sufficiently clean, adherence of the adhesive joint enveloping the reconnected in-lead can be promoted by preparation of the enameled surface. Conventional adhesion promoting agents can be used for this purpose such as the silane coupling material now being sold by the Union Carbide Corporation under the trade name A-1102 for use with epoxy resin adhesive systems. The adhesive joint can be formed by enveloping the end of the disconnected flash lamp in-lead with a liquid organic polymer adhesive and then clamping the assembly to the appropriate location on the circuit board member until sufficient handling strength has been achieved. The full cure properties of said assembly are reached in approximately one-half hour at 60°–70° C. with a commercial two-part epoxy resin adhesive. Circuit continuity is re-established with an electrically conductive surface coating on the adhesive deposit which extends between the bare metal of the flash lamp in-lead and the adjacent circuit board conductive ink strip. Said conductive path on the surface of the adhesive deposit can be provided with a coating of a liquid organic polymer containing an electrically conductive filler such as the silver-filled epoxy resin formulation being sold by Amicon Corporation under the trade name C-926-63. The liquid coating dries in approximately one hour at 60° C. to complete the electrical termination.

DESCRIPTION OF THE PREFERRED EMBODIMENTS

Figure 1:
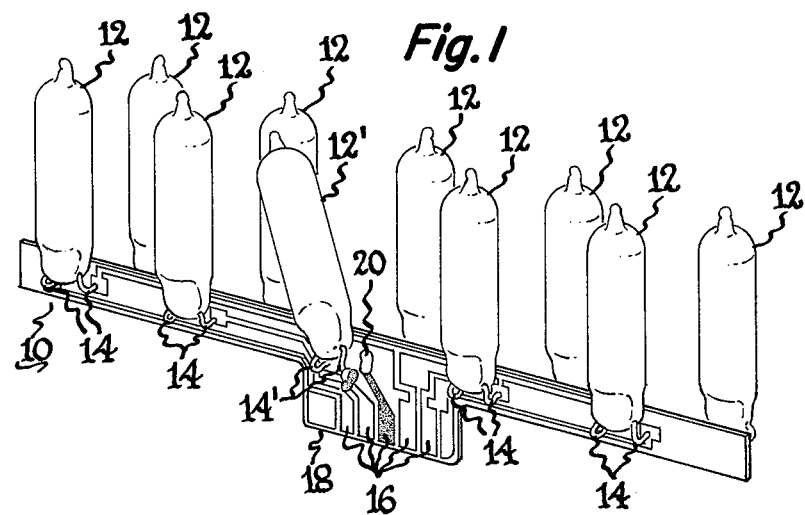
FIG. 1 is a perspective view of the circuit board member and associated flash lamps of a linear flash lamp array.

Referring to FIG. 1, a circuit board member 10 having a plurality of flash lamps 12 operatively associated therewith is shown of the type disclosed in the aforementioned Anderson patent. The in-lead wires 14 of said flash lamps 12 in the array are electrically connected to respective conductive ink strips 16 of a contact tab 18 which extends from the base of said circuit board member. In-leads 14 of flash lamps 12 in said array are shown partially disconnected, however, in that one of said in-leads has physically pulled away from the conductive ink strip to which the disconnected in-lead had been soldered at location 20. As shown, such defect customarily includes some removal of the enameled surface from the circuit board member.

Figure 2:
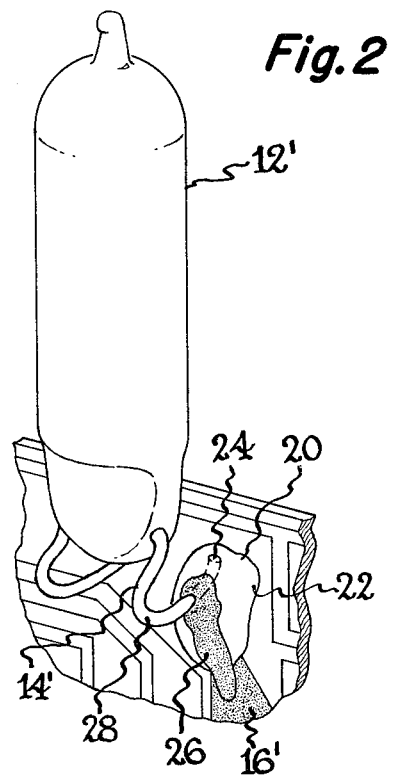
FIG. 2 is a fragmentary perspective view of the disconnected flash lamp shown in FIG. 1 after repair in accordance with the present invention.

The manner of repairing said defect according to the present invention is depicted in FIG. 2. Accordingly, the disconnected in-lead 14' of flash lamp 12' is adhesively bonded at location 20 on the circuit board member with a deposit 22 of a suitable adhesive organic polymer so that end portion 24 of the disconnected in-lead is enveloped by adhesive. An electrical conductive path 26 is estabished between the bare wire surface 28 of said disconnected in-lead at the adhesive joint and conductive ink strip 16' to which said in-lead has been reconnected. The repaired electrical connection successfully passed humidity and mechanical strength requirements as well as circuit continuity tests.

Suitable adhesive organic polymers for use in accordance with the present invention can be epoxy resins of the conventional type which include any monomeric, dimeric, or oligomeric or polymeric epoxy material containing one or a plurality of epoxy functional groups. Additionally, diluents and modifiers may be used along with conventional curing agents to produce the adhesive joint depending upon the particular substrate and conductive ink materials involved. Commercial epoxy adhesives with high shock and peel resistance have been found useful especially when further exhibiting controlled flexibility.

Likewise, a suitable electrically conductive path 26 can be provided on the surface of the adhesive deposit with commercial coating compositions. For example, liquid organic polymer mixtures are commercially available which include sufficient amounts of electrically conductive particulate solids to provide a high degree of electrical conductivity when the coating is dried or cured. By limiting the electrical path on the surface of the adhesive deposit to that between the reconnected in-lead and the conductive ink strip on the circuit board surface, there is little likelihood of developing any short-circuit condition in the lamp firing circuitry.

It will be apparent from the foregoing description that various other embodiments and modifications of the present invention will be apparent to persons skilled in the art. For example, organic polymer adhesives and electrically conductive coatings other than above specifically disclosed can be employed along with modified methods to form an adhesive joint having comparable characteristics. It is intended, therefore, to limit the present invention only by the scope of the following claims.

What I claim as new and desire to secure by Letters Patent of the United States is:

1. A method to electrically reconnect a photoflash lamp in-lead to sequential firing circuitry located on the circuit board member of a planar flash array which comprises:
   a. enveloping the end of said in-lead with a mass of an adhesive organic polymer and securing the adhesive mass to the circuitry, and
   b. applying a conductive path on the surface of said adhesive mass between the in-led and the adjacent circuitry.

2. A method as in claim 1 wherein the conductive path is formed by depositing an electrically conductive coating on the surface of the adhesive mass.

3. A method as in claim 2 wherein said electrically conductive coating comprises an organic polymer and an electrically conductive filler.

* * * * *